United States Patent [19]

Suzuki et al.

[11] Patent Number: 4,639,693
[45] Date of Patent: Jan. 27, 1987

[54] STRIP LINE CABLE COMPRISED OF CONDUCTOR PAIRS WHICH ARE SURROUNDED BY POROUS DIELECTRIC

[75] Inventors: Hirosuke Suzuki, Tokorozawa; Hiromi Yasumoto; Hiroshi Umemoto, both of Umahikizawa Hitaka, all of Japan

[73] Assignee: Junkosha Company, Ltd., Tokyo, Japan

[21] Appl. No.: 723,540

[22] Filed: Apr. 15, 1985

[30] Foreign Application Priority Data

Apr. 20, 1984 [JP] Japan ............................. 59-58184[U]

[51] Int. Cl.$^4$ ............................................. H01P 3/08
[52] U.S. Cl. ....................................... 333/1; 333/238; 174/117 F; 174/117 FF
[58] Field of Search .......................... 333/1, 238, 246; 174/117 F, 117 FF, 117 PC

[56] References Cited

U.S. PATENT DOCUMENTS

| 2,994,050 | 7/1961 | Ayer et al. | 333/238 |
| 3,004,229 | 10/1961 | Stearns | 333/1 X |
| 4,382,236 | 5/1983 | Suzuki | 333/238 X |
| 4,443,657 | 4/1984 | Hill et al. | 174/117 F X |
| 4,490,690 | 12/1984 | Suzuki | 333/238 X |

FOREIGN PATENT DOCUMENTS

| 0013981 | 2/1979 | Japan | 333/238 |
| 0050701 | 4/1980 | Japan | 333/238 |

OTHER PUBLICATIONS

Patrick, R. M., "Flexible Strip Transmission Line"; *IBM Technical Disclosure Bulletin;* vol. 2, No. 6, Apr. 1960; pp. 35-36.

*Primary Examiner*—Eugene R. LaRoche
*Assistant Examiner*—Benny T. Lee
*Attorney, Agent, or Firm*—Mortenson & Uebler

[57] ABSTRACT

An improved strip line cable for transmission of electromagnetic waves in the millimeter wave length range is provided. The cable has a plurality of face to face conductors in pairs, the conductors being separated from their paired counterparts by a porous plastic dielectric insulation material. The cable is jacketed. The improvement comprises the porous plastic dielectric material being, in addition, placed between each conductor and the jacketing material, thereby resulting in each conductor being effectively surrounded by porous plastic dielectric insulating material.

4 Claims, 5 Drawing Figures

STRIP LINE CABLE COMPRISED OF CONDUCTOR PAIRS WHICH ARE SURROUNDED BY POROUS DIELECTRIC

BACKGROUND OF THE INVENTION

This invention relates to a strip line cable comprising a strip or belt-like dielectric material and elongate and narrow electrical conductors which are arranged in parallel to one another in sets of pairs facing each other on both sides of the dielectric material. The strip line cable of this device has improved electric signal transmission characteristics.

Transmission lines for microwave and millimeter wave transmission include waveguides, coaxial lines, and strip lines. Being made up of two conductors, the coaxial lines and strip lines are capable of transmitting direct current as well as alternate current. Because of this capability, they are in general use for electric signal transmission. Particularly, the strip line is attracting attention for use as a signal transmission line for computers and other information processing machines because it holds many conductors in a compact size.

It is generally known that the strip line has improved electric signal transmission characteristics when the dielectric material used is one which has a low dielectric constant and dielectric loss, together with a minimum of frequency dependence. In other words, if the dielectric material has a low dielectric constant, it is possible to reduce the size of the strip line, although its characteristic impedance can remain the same, and the rate of signal transmission increases. If the dielectric material has a low dielectric loss, it is possible to reduce the attenuation of signals. Also, if the dielectric material has a low dielectric constant and dielectric loss with a minimum of frequency dependence, the strip line is capable of transmitting pulse signals with a minimum of distortion.

Thus, the dielectric material used for strip lines is required to have a low dielectric constant and dielectric loss with a minimum of frequency dependence. A known example of such a material is a microcellular material of open-cell structure made of a crystalline organic polymer. This material has such an internal structure that a large number of nodes are connected by minute fibrils and a large number of voids are formed among the nodes and minute fibrils. An example is expanded porous PTFE produced according to the method disclosed in U.S. Pat. No. 3,953,566. Other materials used include polyolefins (polyethylene, polypropylene, polystyrene, etc.), polyamides, polyesters, and fluoroplastics (polytetrafluoroethylene (PTFE), tetrafluoroethylene-hexapropylene copolymer resin (PFA), and tetrafluoroethylene-perfluoroalkylvinylether copolymer resin (PFA), and tetrafluoroethylene-ethylene copolymer (ETFE)) which are made porous by the stretching process, salt leaching process, or solvent evaporation process.

The present inventors noticed that a porous crystalline polymeric material as mentioned above has a low dielectric constant and dielectric loss with a minimum of frequency dependence, which is required for the dielectric material of strip lines. (See Japanese Patent Laid-Open No. 158502/1981 and Japanese Utility Model Laid-Open No. 5820/1984 issued to the present inventors.) When the dielectric material interposed between the pairs of conductors facing each other was made of a porous plastic material having a low dielectric constant, it was possible to improve the performance of the transmission line, particularly to increase the rate of signal transmission. However, it was found that there was a limit in such improvement. In order to further increase the rate of signal transmission, the present inventors carried out extensive studies and conceived the improved structure of strip line according to this invention.

SUMMARY OF THE INVENTION

A strip line cable is provided comprising a plurality of pairs of electrical conductors having a porous strip of dielectric insulation material interposed between the conductors of the pairs, and a covering jacket covering the conductors and having, in addition, an insulation layer of a porous plastic dielectric material provided between the conductors and the covering jacket. The porous insulation material is preferably expanded, porous polytetrafluoroethylene. The covering may have a shielding layer provided on the outer periphery thereof. An insulation layer of a nonporous plastic material may be interposed between the strip of dielectric material and the conductors on at least one side of the strip, to improve the transmission characteristics of the cable.

DETAILED DESCRIPTION OF THE INVENTION AND PREFERRED EMBODIMENTS WITH REFERENCE TO THE DRAWINGS

An improved strip line cable for transmission of electromagnetic waves in the millimeter wave length range is provided. The cable has a plurality of face to face conductors in pairs, the conductors being separated from their paired counterparts by a porous plastic dielectric insulation material. The cable is jacketed. The improvement comprises the porous plastic dielectric material being, in addition, placed between each conductor and the jacketing material, thereby resulting in each conductor being effectively surrounded by porous plastic dielectric insulating material.

According to the present invention, there is provided a strip line cable made up of a plurality of pairs of conductors facing each other, a strip or belt-like porous dielectric material interposed between the pairs of conductors, and a covering holding them together. The covering is formed by integral molding, fusion bonding, or adhesion of tape or tapes of PTFE, PFA, FEP, ETFE, or polyester. The strip line of this device is characterized in that an insulation layer of a porous plastic material, preferably expanded, porous PTFE, is interposed between at least one conductor and the covering. The plastic material for the insulation layer should preferably be a fluoroplastic which is superior in electrical and thermal properties to other materials.

The present device is best described in detail with reference to the drawings and the following examples, which are not intended to restrict the scope of the present device but may be modified without departing from the scope of the present invention.

Figure 1:
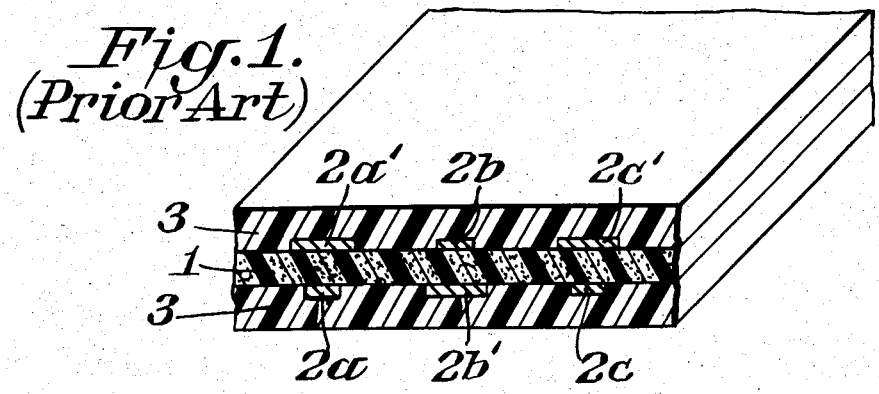
FIG. 1 is a schematic view, partly in cross-section of a conventional strip line cable.

FIG. 1 shows an example of a conventional strip line cable.

Figure 2:
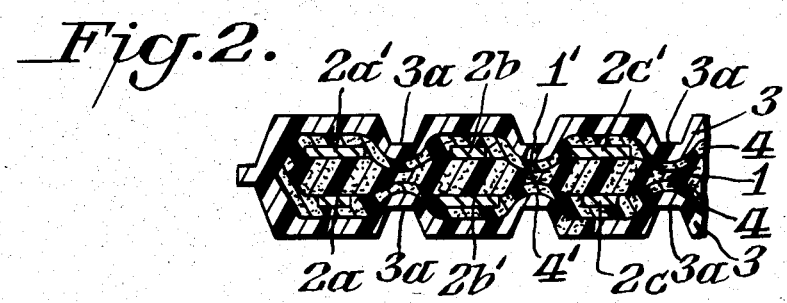
FIGS. 2-5 are cross-sectional views of various embodiments of strip line cables according to this invention.

FIG. 2 is a first embodiment of the present device, in which the same reference numerals used in FIG. 1 are used for like terms.

In the strip line cable shown in FIG. 2, the porous strip or belt-like dielectric material 1 is expanded, porous PTFE tape having a specific gravity of 0.68 and a thickness of 0.24 mm, produced by known methods. On both sides of this dielectric material 1 are arranged three sets of paired conductors 2a, 2a'; 2b, 2b'; and 2c, 2c', facing each other, parallel to one another at proper intervals. Each of the conductors 2a, 2b, 2c is a silver-plated copper wire having a rectangular cross-section, 0.5 mm wide and 0.1 mm thick. Each of the conductors 2a', 2b', and 2c' is a silver-plated copper wire having a rectangular cross-section, 0.8 mm wide and 0.1 mm thick. Between the silver-plated rectangular copper wires and the covering 3 is interposed in the longitudinal direction an insulation layer 4 which is expanded, porous PTFE tape having a specific gravity of 0.68 and a thickness of 0.127 mm. For the sake of convenience, there is shown three sets of conductors in this embodiment. As many sets of conductors as required may be selected.

The assembly of the expanded, porous PTFE tape 1 and the conductors arranged on both sides thereof is covered entirely with a covering which is a laminate composed of an unsintered, unstretched and unexpanded PTFE layer 3 (0.127 mm thick) and an unsintered, expanded, porous PTFE layer 4 (0.127 mm thick and 0.68 in specific gravity). The former layer is placed outside. The assembly thus produced is passed through calender rolls (not shown) and then through a heating bath for 30 minutes, so that the unsintered PTFE layers (one expanded and the other unstretched) are sintered. Thus there is obtained an integral, fusion bonded body composed of the external covering 3, the insulation layer 4, and the expanded, porous PTFE dielectric tape 1. The expanded, porous PTFE tape may be incompletely or partially sintered, and the cable is still useful.

The strip line cable as described above has the following dimensions and properties. The porous PTFE tape 1 is 0.17 mm thick. The distance between adjacent conductors is 1.27 mm. The characteristic impedance is 50 ohms. The propagation delay time is 3.7 ns/m, which is comparable to 3.9 ns/m in the case of a conventional strip line cable (as shown in FIG. 1) in which the individual conductors are directly covered with the covering 3 made of solid, nonporous insulation material. In addition, the strip line is superior to conventional ones in faithful pulse transmission characteristics and decreased crosstalk between adjacent conductors and between adjacent layers.

In the case of the embodiment shown in FIG. 2, compression is accomplished by using a pressure roll system having projecting parts which press only the part held between adjacent conductors. Pressing with such a roll forms grooves 3a in the outer covering, and, as a result, the dielectric material 1 and the insulation layer 4 are compressed as indicated by reference numerals 1' and 4'. The configuration in this embodiment is effective in decreasing crosstalk between lines or between layers for the reasons mentioned below. The compressed parts 1' and 4' decrease in porosity and increase in dielectric constant as compared with the other parts of the dielectric material 1 and insulation layer 4 which remain uncompressed. Each conductor (2a, 2a'; 2b, 2b', and 2c, 2c') is surrounded by the compressed parts 1' and 4' (having an increased dielectric constant) and the outer covering 3 (having originally a high dielectric constant). This surrounding material absorbs electromagnetic waves, reducing their diffusion. In addition, the grooves formed as mentioned above prevent the strip line from being deformed by force applied in the thickness direction and prevent the conductors from moving in the transverse or widthwise direction.

Figure 3:
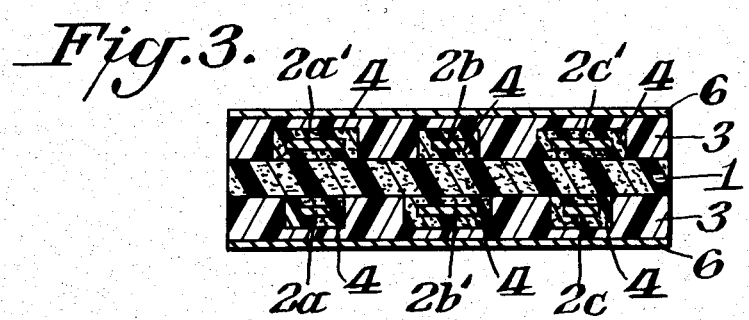
Figure 4:
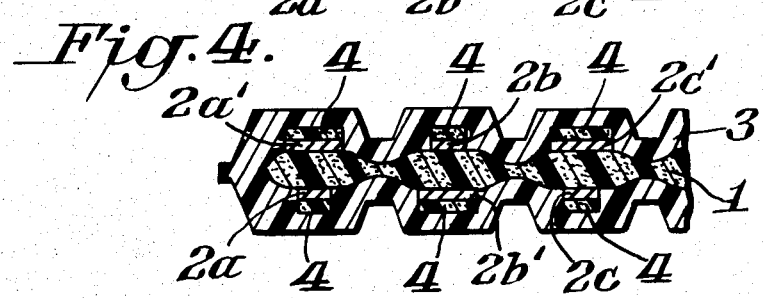
Figure 5:
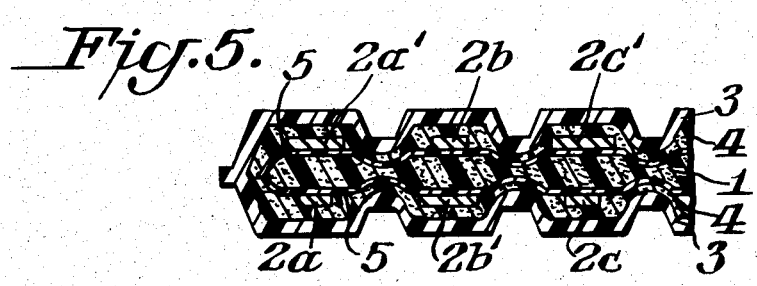

FIGS. 3, 4 and 5 show other embodiments of the present invention. In the embodiment shown in FIG. 3, each conductor (2a, 2a'; 2b, 2b'; and 2c, 2c') is first covered entirely with an insulation layer 4 made of a porous plastic material. The covered conductors are arranged on both sides of the porous strip or belt-like dielectric material 1, and the outer covering 3, made of a nonporous plastic material, is placed on the encased conductors. In the embodiment shown in FIG. 4, the insulation layer 4 of porous plastic material is arranged on one side of each conductor (2a, 2a'; 2b, 2b'; and 2c, 2c') opposite to the porous strip or belt-like dielectric material 1. In both embodiments as shown in FIG. 3 and FIG. 4, it is permissible to arrange the insulation layer 4 on only one of the paired signal conductors (e.g., 2a, 2b, and 2c). It will be easily understood that the embodiments of these structures also produce improved transmission characteristics.

In the embodiment shown in FIG. 5, a thin insulation layer 5, which is a nonporous plastic tape such as unstretched PTFE tape, is provided between the porous or belt-like dielectric material 1 and the paired conductors (2a, 2a'; 2b, 2b'; and 2c, 2c'). This insulation layer increases the dielectric strength of the strip line with a minimum effect on propagation delay time. This insulation layer 5 may be formed on only one side of the belt-like dielectric material 1.

In any one of the above-mentioned embodiments, the porous strip or belt-like dielectric material 1 and/or the insulation layer 4 of porous plastic material may be made of the porous plastics film having a large number of through holes which is produced according to the process disclosed in Japanese Patent Laid-Open No. 176132/1982 "Sheetlike Resin Material". The conductors used in the strip line of this device are not limited to those mentioned above. They may be solid wires having a round cross-section or twisted or multiple lines, and they may be copper wire, silver-plated wire, copper-clad steel wire, or gold-plated stainless steel wire.

The strip line cable of this invention is constructed of a strip or belt-like dielectric material, a plurality of paired conductors, a porous insulation layer, and an outer covering. The strip or belt-like dielectric material is made of a porous crystalline polymeric material, preferably expanded, porous PTFE, which has a low dielectric constant and dielectric loss with a minimum of frequency dependence. The conductors are arranged parallel to one another at proper intervals on both sides of the strip or belt-like material. The insulation layer is made of a porous plastic material, preferably expanded, porous PTFE, having outstanding electrical properties. It is interposed between at least one of the paired conductors and the outer covering. This arrangement absorbs electromagnetic waves in the dielectric material surrounding the signal wires, and reduces propagation delay time. In addition to the above-mentioned components, a solid thin plastic layer may be interposed between the conductors and the strip or belt-like dielectric material in order to increase the dielectric strength of the strip line cable.

The strip or belt-like material made of porous crystalline polymeric material is covered by a material having a higher dielectric constant than said dielectric material. This structure causes the electric field to concentrate within the covering and prevents the electric field of each conductor from radiating outside. This reduces the interlayer crosstalk and interline crosstalk which may take place when the strip lines are placed on top of each other. In addition to the above-mentioned advantages, the strip line cable of this invention has another advantage in that it is easy to handle for terminal formation. The resin covering can be easily removed by cutting with a knife.

If necessary, the strip line may be entirely covered with a shielding layer 6 made, e.g., of metal or conductive fluoroplastic as shown in FIG. 3. In the case in which the shielding layer is so close to the conductors that the transmission characteristic may be adversely affected, it will be necessary to make the covering thicker or to interpose a layer of porous crystalline polymeric material, e.g., expanded, porous PTFE, between at least one side of the covering and the shielding layer. In the latter case, it is easy to remove the shielding layer from the main body.

The shape and combination of the conductors are not limited to the embodiments mentioned above. The positions of conductors 2b and 2b' may be exchanged. In the case where rectangular conductors are used, the conductors 2a, 2b, and 2c for signal transmission may be thinner than the grounding conductors 2a', 2b', and 2c', so that interlayer crosstalk is reduced.

In the case where the strip line is used in the form of a flat cable, the terminals may be separated from one another or the paired lines at intermediate locations may be separated from one another so as to reduce crosstalk and improve flexibility.

While the invention has been disclosed herein in connection with certain embodiments and detailed descriptions, it will be clear to one skilled in the art that modifications or variations of such details can be made without deviating from the gist of this invention, and such modifications or variations are considered to be within the scope of the claims hereinbelow.

What is claimed is:

1. A strip line cable comprising a plurality of pairs of electrical conductors having a porous strip of dielectric insulation material interposed between the conductors of said pairs, and a covering jacket covering said conductors and having, in addition, an insulation layer of a porous plastic dielectric material provided between said conductors and said covering jacket such that porous dielectric surrounds each individual said conductor.

2. The cable of claim 1 wherein the porous insulation material is expanded, porous polytetrafluoroethylene.

3. The cable of claim 1 wherein said covering has a shielding layer on the outer periphery thereof.

4. The cable of claim 1 wherein an insulation layer of a nonporous plastic material is interposed between said strip of dielectric material and said conductors on at least one side of said strip.

* * * * *